United States Patent
Pan et al.

(10) Patent No.: US 8,278,686 B2
(45) Date of Patent: Oct. 2, 2012

(54) STRUCTURE AND METHOD FOR FORMING PLANAR GATE FIELD EFFECT TRANSISTOR WITH LOW RESISTANCE CHANNEL REGION

(75) Inventors: James Pan, West Jordan, UT (US); Qi Wang, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 13/103,728

(22) Filed: May 9, 2011

(65) Prior Publication Data

US 2011/0215377 A1 Sep. 8, 2011

Related U.S. Application Data

(62) Division of application No. 12/891,616, filed on Sep. 27, 2010, now Pat. No. 7,943,993, which is a division of application No. 12/330,273, filed on Dec. 8, 2008, now Pat. No. 7,825,465.

(60) Provisional application No. 61/013,411, filed on Dec. 13, 2007.

(51) Int. Cl.
*H01L 29/10* (2006.01)
*H01L 29/786* (2006.01)
*H01L 21/28* (2006.01)

(52) U.S. Cl. ........ 257/192; 257/335; 257/343; 257/345; 257/368; 257/616; 257/E29.066; 257/E29.297; 257/E29.298; 257/E21.182; 438/197; 438/230; 438/933

(58) Field of Classification Search ................ 257/192, 257/335, 343, 345, 368, 616, E29.066, E29.297, 257/E29.298, E21.182; 438/197, 230, 933
See application file for complete search history.

(56) References Cited

U.S. PATENT DOCUMENTS

| | | | |
|---|---|---|---|
| 5,451,800 | A | 9/1995 | Mohammad |
| 5,534,713 | A | 7/1996 | Ismail et al. |
| 6,020,600 | A | 2/2000 | Miyajima et al. |
| 6,191,432 | B1 | 2/2001 | Sugiyama et al. |
| 6,200,866 | B1 | 3/2001 | Ma et al. |
| 6,239,463 | B1 * | 5/2001 | Williams et al. ............ 257/328 |
| 6,255,692 | B1 | 7/2001 | Huang |
| 6,274,905 | B1 | 8/2001 | Mo |
| 6,350,993 | B1 | 2/2002 | Chu et al. |

(Continued)

FOREIGN PATENT DOCUMENTS

WO WO 2006/042040 A2 4/2006

(Continued)

OTHER PUBLICATIONS

Ahoujja et al., "Electrical properties of boron-doped p-SiGeC grown on n—Si substrate," Applied Physics Letters, 77(9):1327-1329 (Aug. 28, 2000).

(Continued)

*Primary Examiner* — Victor A Mandala

(57) ABSTRACT

A vertically-conducting planar-gate field effect transistor includes a silicon region of a first conductivity type, a silicon-germanium layer extending over the silicon region, a gate electrode laterally extending over but being insulated from the silicon-germanium layer, a body region of the second conductivity type extending in the silicon-germanium layer and the silicon region, and source region of the first conductivity type extending in the silicon-germanium layer. The gate electrode laterally overlaps both the source and body regions such that a portion of the silicon germanium layer extending directly under the gate electrode between the source region and an outer boundary of the body region forms a channel region.

4 Claims, 14 Drawing Sheets

U.S. PATENT DOCUMENTS

| | | | |
|---|---|---|---|
| 6,373,112 | B1 | 4/2002 | Murthy et al. |
| 6,373,122 | B1 | 4/2002 | Sivilotti et al. |
| 6,531,748 | B2 | 3/2003 | Pfirsch |
| 6,620,664 | B2 | 9/2003 | Ma et al. |
| 6,700,180 | B2 | 3/2004 | Huang |
| 6,709,912 | B1 | 3/2004 | Ang et al. |
| 6,885,084 | B2 | 4/2005 | Murthy et al. |
| 6,887,760 | B2 | 5/2005 | Curro et al. |
| 6,902,967 | B2 | 6/2005 | Beasom |
| 6,943,407 | B2 | 9/2005 | Ouyang et al. |
| 7,078,283 | B1 | 7/2006 | Wang |
| 7,078,782 | B2 | 7/2006 | Shirai et al. |
| 7,238,985 | B2 | 7/2007 | Jones et al. |
| 7,345,342 | B2 | 3/2008 | Challa et al. |
| 7,459,365 | B2 | 12/2008 | Rub et al. |
| 7,504,303 | B2 | 3/2009 | Yilmaz et al. |
| 7,504,691 | B2 | 3/2009 | Park et al. |
| 7,755,137 | B2 | 7/2010 | Dolny et al. |
| 7,825,465 | B2 | 11/2010 | Pan et al. |
| 7,943,993 | B2 | 5/2011 | Pan et al. |
| 2003/0146428 | A1 | 8/2003 | Ma et al. |
| 2003/0227072 | A1 | 12/2003 | Forbes et al. |
| 2004/0173846 | A1* | 9/2004 | Hergenrother et al. ........ 257/335 |
| 2004/0180485 | A1 | 9/2004 | Beasom |
| 2004/0256639 | A1 | 12/2004 | Ouyang et al. |
| 2005/0035400 | A1 | 2/2005 | Shirai et al. |
| 2005/0116217 | A1 | 6/2005 | Jones et al. |
| 2005/0199873 | A1 | 9/2005 | Tanaka et al. |
| 2005/0242396 | A1* | 11/2005 | Park et al. ...................... 257/347 |
| 2006/0118863 | A1 | 6/2006 | Dolny et al. |
| 2006/0157806 | A1 | 7/2006 | Rhodes |
| 2006/0226455 | A1 | 10/2006 | Lee et al. |
| 2006/0273386 | A1 | 12/2006 | Yilmaz et al. |
| 2006/0292805 | A1 | 12/2006 | Kawamura et al. |
| 2007/0108513 | A1 | 5/2007 | Rub et al. |
| 2007/0246742 | A1* | 10/2007 | Meunier-Beillard et al. .. 257/190 |
| 2008/0265313 | A1* | 10/2008 | Loechelt et al. .............. 257/329 |
| 2009/0014814 | A1 | 1/2009 | Loechelt et al. |
| 2009/0042359 | A1* | 2/2009 | Lindsay et al. ................ 438/433 |
| 2009/0114949 | A1 | 5/2009 | Hebert |
| 2009/0194811 | A1 | 8/2009 | Pan et al. |
| 2010/0117159 | A1* | 5/2010 | Lindsay ........................ 257/369 |
| 2010/0244127 | A1 | 9/2010 | Ho et al. |
| 2012/0061737 | A1* | 3/2012 | Lin et al. ........................ 257/288 |

FOREIGN PATENT DOCUMENTS

| | | |
|---|---|---|
| WO | WO 2008/027722 A2 | 3/2008 |
| WO | WO 2009/076362 A1 | 6/2009 |

OTHER PUBLICATIONS

Baliga, B. J., Power Semiconductor Devices, 3rd Edition, cover page and pp. 362-367 (1996).

Bouillon et al., "Search for the optimal channel architecture for 0.18/0.12 μm bulk CMOS Experimental study," IEDM Tech. Digest, 96:559-562 (1996).

Chang et al., "Suppression of boron penetration by polycrystalline $Si_{1-x-y}Ge_xC_y$ in metal-oxide-semiconductor structures," Applied Physics Letters, 74(17):2501-2503 (Apr. 26, 1999).

Fischetti et al., "Band structure, deformation potentials, and carrier mobility in strained Si, Ge, and SiGe alloys," J. Appl. Phys., 80(4):2234-2252 (Aug. 15, 1996).

Huang et al., "Effect of polysilicon depletion on MOSFET I-V characteristics," Electronics Letters, 29(13):1208-1209 (Jun. 24, 1993).

King et al., "Electrical Properties of Heavily Doped Polycrystalline Silicon-Germanium Films," IEEE Transactions on Electron Devices, 41(2):228-232 (Feb. 1994)

Lang et al., "Measurement of the band cap of $Ge_xSi_{1-x}$/Si strained-layer heterostructures," Appl. Phys. Lett., 47(12):1333-1335 (Dec. 15, 1985).

Langdo et al., "SiGe-free strained Si on insulator by wafer bonding and layer transfer," Applied Physics Letters, 82(24):4256-4258 (Jun. 16, 2003).

Lee et al., "Observation of Reduced Boron Penetration and Gate Depletion for Poly-$Si_{0.8}Ge_{0.2}$ Gated PMOS Devices," IEEE Electron Device Letters, 20(1):9-11 (Jan. 1999).

Leitz et al., "Hole mobility enhancements in strained Si/$Si_{1-y}Ge_y$ p-type metal-oxide-semiconductor field-effect transistors grown on relaxed $Si_{1-x}Ge_x$ (x<y) virtual substrates," Applied Physics Letters, 79(25):4246-4248 (Dec. 17, 2001).

Li et al., "Carrier velocity-field characteristics and alloy scattering potential in $Si_{1-x}Ge_x$/Si," Appl. Phys. Lett., 63(10):1393-1395 (Sep. 6, 2003).

Ricco et al., "Characterization of Polysilicon-Gate Depletion in MOS Structures," IEEE Electron Device Letters, 17(3):103-105 (Mar. 1996).

Stewart et al., "Suppression of Boron Penetration in P-Channel MOSFETs Using Polycrystalline $Si_{1-x-y}Ge_xC_y$ Gate Layers," IEEE Electron Device Letters, 22(12):574-576 (Dec. 21, 2001).

Sun et al., "Electron Mobility in Inversion and Accumulation Layers on Thermally Oxidized Silicon Surfaces," IEEE Trans. Electron Devices, vol. ED-27, 12 pages (1980).

Sze, eds., cover page, table of contents and pp. 160-163 from Modern Semiconductor Device Physics, John Wiley & Sons (1998).

Terauchi et al., "Suppression of the Floating-Body Effects in SOI MOSFETs by Bandgap Engineering," 1995 Symp. VLSI Tech. Digest of Technical Papers, pp. 35-36 (1995).

Van De Walle et al., "Theoretical calculations of heterojunction discontinuities in the Si/Ge system," Physical Review B, 34(8):5621-5634 (Oct. 15, 1988).

Chinese Office Action for Application No. 200580034226.2, dated Jun. 27, 2008, 8 pages.

Chinese Office Action for Application No. CN200580034226.2, dated Oct. 16, 2009, 9 pages.

International Search Report of the International Searching Authority for Application No. PCT/US2005/036036, mailed on Jan. 3, 2007, 3 pages.

International Search Report of the International Searching Authority for Application No. PCT/US2007/075911, mailed on Feb. 25, 2008, 2 pages.

International Search Report of the International Searching Authority for Application No. PCT/US2008/086081, mailed on Feb. 19, 2009, 1 page.

International Preliminary Report on Patentability for Application No. PCT/US2005/036036, mailed on Apr. 11, 2007, 4 pages.

International Preliminary Report on Patentability of Mar. 3, 2009 for International Application No. PCT/US2007/075911.

International Preliminary Report on Patentability for Application No. PCT/US2008/086081, mailed on Jun. 24, 2010, 9 pages.

Written Opinion of the International Searching Authority for Application No. PCT/US2005/036036, mailed on Jan. 3, 2007, 4 pages.

Written Opinion of the International Searching Authority for Application No. PCT/US2007/075911, mailed on Feb. 25, 2008, 7 pages.

Written Opinion of the International Searching Authority for Application No. PCT/US2008/086081, mailed on Feb. 19, 2009, 8 pages.

Non-Final Office Action for U.S. Appl. No. 11/245,995, mailed on Jun. 25, 2009.

Non-Final Office Action for U.S. Appl. No. 11/245,995, mailed on Nov. 30, 2009.

Non-Final Office Action for U.S. Appl. No. 11/469,456, mailed on Mar. 17, 2008.

Final Office Action for U.S. Appl. No. 11/245,995, mailed on Oct. 16, 2008.

Final Office Action for U.S. Appl. No. 11/245,995, mailed on Oct. 6, 2009.

Notice of Allowance for U.S. Appl. No. 11/245,995, mailed on Mar. 9, 2010.

Notice of Allowance for U.S. Appl. No. 12/330,273, mailed on Jun. 30, 2010.

Notice of Allowance for U.S. Appl. No. 11/469,456, mailed on Oct. 15, 2008.

Notice of Allowance for U.S. Appl. No. 11/469,456, mailed on Jan. 12, 2009.

Notice of Allowance for U.S. Appl. No. 12/891,616, mailed on Jan. 11, 2011.

China State Intellectual Property Office (SIPO) office action for SIPO patent application CN CN200880120765.1 (Sep. 15, 2011).

* cited by examiner

STRUCTURE AND METHOD FOR FORMING PLANAR GATE FIELD EFFECT TRANSISTOR WITH LOW RESISTANCE CHANNEL REGION

CROSS-REFERENCE TO RELATED APPLICATIONS

This application is a division of U.S. application Ser. No. 12/891,616, filed Sep. 27, 2010, now U.S. Pat. No. 7,943,993, which is a division of U.S. application Ser. No. 12/330,273, filed Dec. 8, 2008, now U.S. Pat. No. 7,825,465, which claims the benefit of U.S. Provisional Application No. 61/013,411, filed Dec. 13, 2007. All are incorporated herein by reference in their entirety for all purposes.

BACKGROUND

The present invention relates in general to semiconductor structures and methods for forming the same, and more particularly to semiconductor power field effect transistors (FETs) with low resistance channel regions.

Some conventional vertically conducting trench-gate power MOSFETs include an n-type substrate over which an n-type epitaxial layer extends. The substrate embodies the drain of MOSFET. A p-type body region extends into the epitaxial layer. Trenches extend through the body region and into the portion of the epitaxial layer bounded by the body region and the substrate (commonly referred to as the drift region). A dielectric layer lines the sidewalls and bottom of each trench. Gate electrodes (e.g., from polysilicon) are formed in the trenches and embody the gate of the MOSFET. Source regions extend into the body regions and flank the trenches. Heavy body regions are formed in the body regions between the source regions. When the MOSFET is in the on state, a current flows vertically through the channel region formed in the body region between the source regions and the drift region along the trench sidewalls.

To obtain high current capability, the transistor on-resistance needs to be reduced. One contributing factor to the on-resistance is the channel resistance. Also, minimizing the resistance of the body region helps improve the UIS (unclamped inductive switching) capability of the transistor. Various techniques for reducing the channel resistance and/or the resistance of the body region have been proposed but with limited success. Thus, there is a need for techniques which enable significant reduction in the channel resistance and the resistance of the body region for n-channel and p-channel power transistors.

BRIEF SUMMARY

In accordance with one embodiment of the invention, a trench-gate field effect transistor includes trenches extending into a silicon region of a first conductivity type, and a gate electrodes in each trench. Body regions of second conductivity type extend over the silicon region between adjacent trenches. Each body region forms a first PN junction with the silicon region, and each body region includes a silicon-germanium layer of the second conductivity type laterally extending between adjacent trenches. Source regions of the first conductivity flank the trenches, and each source region forms a second PN junction with one of the body regions. Channel regions extend in the body regions along sidewalls of the trenches between the source regions and a bottom surface of the body regions. The silicon-germanium layers extend into corresponding channel regions to thereby reduce the channel resistance.

In one embodiment, the silicon-germanium layer is spaced a predetermined distance from the second PN junctions.

In accordance with another embodiment of the invention, an N-channel trench-gate field effect transistor includes trenches extending into an N-type silicon region, and a gate electrode in each trench. Body regions of P-type conductivity extend over the silicon region between adjacent trenches, and each body region includes a lower silicon layer of P-type conductivity forming a first PN junction with the N-type silicon region, a silicon-germanium layer of P-type conductivity over the lower silicon layer, and an upper silicon layer of P-type conductivity over the silicon-germanium layer. Source regions of N-type conductivity type flank the trenches, and each source region forms a second PN junction with the upper silicon layer.

In one embodiment, channel regions extend in the body regions along sidewalls of the trenches between the source regions and a bottom surface of the body regions. The silicon-germanium layers extend into corresponding channel regions to thereby reduce the channel resistance.

In accordance with another embodiment of the invention, a trench-gate field effect transistor includes trenches extending into a silicon region of a first conductivity type, and a gate electrode in each trench. Body regions of a second conductivity type extend over the silicon region between adjacent trenches, and each body region forms a PN junction with the silicon region. A gate dielectric layer lines at least upper sidewalls of each trench, and the gate dielectric layer insulates the gate electrode from the body region. Source regions of the first conductivity flank the trenches. A silicon-germanium region vertically extends through each source region and through a corresponding body region. The silicon-germanium region terminates within the corresponding body region before reaching the PN junction.

In one embodiment, when the transistor is in an on state, a channel region is formed in the body region along each trench sidewall between each source region and a bottom surface of a corresponding body region, and the silicon-germanium region forms at least a part of the channel region so as to reduce the channel resistance.

In accordance with another embodiment of the invention, a vertically-conducting planar-gate field effect transistor includes a silicon region of a first conductivity type, a silicon-germanium layer extending over the silicon region and a gate electrode laterally extending over but being insulated from the silicon-germanium layer. A body region of the second conductivity type extends in the silicon-germanium layer and the silicon region. A source region of the first conductivity type extends in the silicon-germanium layer. The gate electrode laterally overlaps both the source and body regions such that a portion of the silicon germanium layer extending directly under the gate electrode between the source region and an outer boundary of the body region forms a channel region.

In one embodiment, the portion of the silicon-germanium layer through which the source region extends is of first conductivity type, and the portion of the silicon-germanium layer through which the body region extends is of the second conductivity type.

In accordance with another embodiment of the invention, a method for forming a trench-gate field effect transistor includes the following steps. Trenches extending into a silicon region of a first conductivity type are formed. A gate electrode is formed in each trench. Body regions of a second conductivity are formed such that each body region includes a lower silicon region forming a first PN junction with the silicon region, a silicon-germanium layer over the lower silicon layer, and an upper silicon layer over the silicon-germanium layer. Source regions of the first conductivity type flanking the trenches are formed such that each source region forms a second PN junction with the upper silicon layer.

In one embodiment, the step of forming body regions includes the following steps. A silicon-germanium layer is formed over the silicon region. An epitaxial silicon layer is formed over the silicon-germanium layer, where the epitaxial silicon layer forms the upper silicon layer. Dopants of second conductivity type are implanted through the silicon-germanium layer and the epitaxial silicon layer to thereby form an implant region in the silicon region, where the implant region forms the lower silicon layer.

In another embodiment, the step of forming body regions includes the following steps. Dopants of the second conductivity type are implanted to form an implant region of the second conductivity type in the silicon region. Dopants are implanted to form a layer of silicon-germanium layer within the implant region such that a portion of the implant region extending below the silicon-germanium layer forms the lower silicon region, and a portion of the implant region extending over the silicon-germanium layer forms the upper silicon region.

In accordance with another embodiment of the invention, a method for forming a trench-gate field effect transistor includes the following steps. Trenches extending into a silicon region of a first conductivity type are formed. Body regions of a second conductivity are formed such that each body region forms a PN junction with the silicon region, and each body region includes a vertically extending silicon-germanium layer. A gate electrode is formed in each trench. Source regions of the first conductivity flanking the trenches are formed. The silicon-germanium layers are formed so as to terminate along the vertical dimension before reaching the PN junction.

In one embodiment, the step of forming body regions includes the following steps. A dielectric layer is formed in each trench. Upper trench sidewalls are lined with a silicon-germanium layer over the dielectric layer. The dielectric layer is recessed to expose a portion of each trench sidewall directly below the silicon-germanium layer. An epitaxial silicon layer is formed inside the trench such that the epitaxial layer lines the exposed portion of each trench sidewall. Dopants of the second conductivity type are implanted into the silicon region, the silicon-germanium layer and the epitaxial silicon layer to thereby form the body region.

In accordance with another embodiment of the invention, a method of forming a vertically-conducting planar-gate field effect transistor includes the following steps. A silicon-germanium layer is formed over a silicon region of a first conductivity type. A gate electrode laterally extending over but insulated from the silicon-germanium layer is formed. A body region of a second conductivity type extending in the silicon-germanium layer and the silicon region is formed. A source region of the first conductivity type extending at least into the silicon-germanium layer is formed. The gate electrode laterally overlaps both the source and body regions such that a portion of the silicon germanium layer extends directly under the gate electrode between the source region and an outer boundary of the body region forms a channel region.

DETAILED DESCRIPTION

In accordance with embodiments of the present invention, structures and methods for forming power field effect transistors (such as n-channel and p-channel variations of MOSFETs and IGBTs) with a silicon-germanium layer advantageously integrated therein so as to obtain a low channel resistance are described. In some embodiments, the silicon-germanium layer is embedded in the body region in a particular manner so as to reduce both the channel resistance and the overall resistance of the body region without inducing leakage current or adversely impacting the transistor breakdown voltage. The techniques in accordance with the invention may be implemented in many types of FETs, including both the N-channel and P-channel variations of trench gate, shielded gate and planar gate MOSFETs and IGBTs. Implementation of one exemplary embodiment of the invention in an N-channel shielded gate FET will be described first with reference to FIGS. 1 and 2A-2F.

Figure 1:
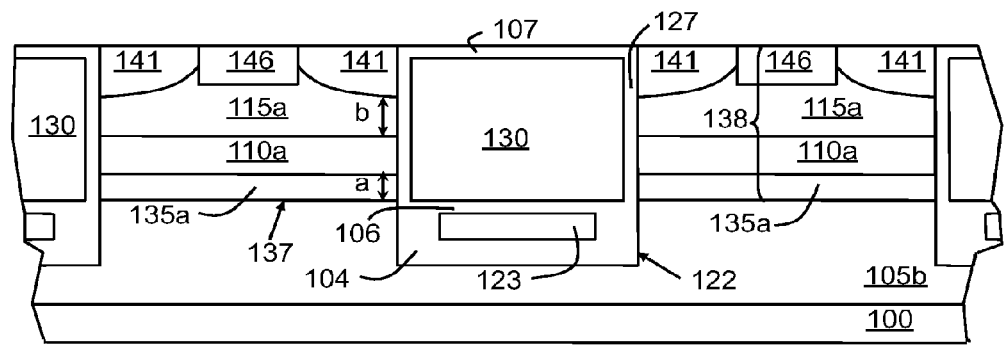
FIG. 1 is a simplified cross section view of an N-channel shielded gate FET with a silicon germanium layer embedded in the body region in accordance with an embodiment of the invention.

FIG. 1 is a simplified cross section view of an N-channel shielded gate FET with a silicon germanium layer embedded in the body region in accordance with an embodiment of the invention. The FET includes a highly doped substrate 100. Substrate 100 may be N-type in the case of an N-channel MOSFET or P-type in the case of an N-channel IGBT. Lightly doped N-type drift region 105*b* extends over substrate 100. P-type body region 138 extends over drift region 105*b*. Body region 138 comprises lower silicon layer 135*a*, middle silicon-germanium (SiGe) layer 110*a* and upper silicon layer 115*a*. Thus, SiGe layer 110*a* is sandwiched between two P-type silicon layers 135*a* and 115*a*.

Trenches 122 extend through body region 138 and terminate in drift region 105*b*. In an alternate embodiment, trenches 122 extend deeper and terminate within substrate 100. Shield dielectric 104 (e.g., comprising one or both of oxide and nitride layers) lines lower sidewalls and bottom of each trench 122. Shield electrode 123 (e.g., comprising doped or undoped polysilicon) fills a lower portion of each trench 122. Shield dielectric 104 insulates shield electrode 123 from drift region 105b. The shape of shield electrodes 123 as shown in FIG. 1 is strictly illustrative. In practice, shield electrodes 123 may extend longer along the vertical dimension than along the lateral dimension.

Inter-electrode dielectric 106 (e.g., comprising one or more oxide layers) laterally extends over shield electrode 123. Gate dielectric 127 (e.g., comprising gate oxide) lines upper trench sidewalls. Gate electrode 130 (e.g., comprising doped or undoped polysilicon) fills an upper portion of each trench 122. Inter-electrode dielectric (IED) 106 insulates the gate and shield electrodes from one anther. In one embodiment, IED 106 and gate dielectric 127 are of substantially the same thickness. In another embodiment, IED 106 and shield dielectric 104 are both thicker than gate dielectric 127. Dielectric cap 107 (e.g., comprising oxide and/or BPSG) extends over gate electrode 130. Highly doped N-type source regions 141 are in upper silicon layer 115a adjacent trenches 122. Highly doped P-type heavy body regions 146 are in upper silicon layer 115a between adjacent source regions 141.

A top-side interconnect layer (not shown) extends along the top-side of the structure and electrically contacts source regions 141 and heavy body regions 146. A bottom-side interconnect layer (not shown) extends along the bottom-side of the structure to electrically contact substrate 100. In one embodiment, the top-side and bottom-side interconnect layers comprise a metal. Dielectric cap 107 insulates gate electrodes 130 form the top-side interconnect layer. In an alternate embodiment, dielectric cap 107 is dome-shaped and extends out of each trench to laterally overlap source regions 141.

Because the lattice structures of silicon-germanium and silicon are different, when the SiGe layer is being formed during the manufacturing process, the SiGe layer becomes strained upon coming in contact with the underlying silicon. A strained SiGe layer can thus be formed. Such a strained SiGe layer provides a higher carrier mobility than silicon specially when carriers are transported in the vertical direction (i.e., perpendicular to the interface between SiGe 110a and lower silicon layer 135a).

When the FET is turned on a channel is formed in body region 138 along each trench sidewall between source regions 141 and drift region 105b. The channel region thus vertically extends through upper silicon layer 115a, middle SiGe layer 110a, and lower silicon layer 135a along each trench sidewall. When the FET is turned on, the electrons in the channel region are transported in the direction perpendicular to the interface between middle SiGe layer 110a and lower silicon layer 135a and thus enjoy a lower resistance when traveling through middle SiGe layer 110a. The lower channel resistance in turn reduces the transistor Rdson as compared to prior art structures where no SiGe layer is embedded in the body region. Further, because SiGe layer 110a forms a middle part of body region 138, the overall resistance of body region 138 is reduced which in turn improves the transistor switching performance (e.g., UIS characteristics).

It has been found that structures where a SiGe layer extends through a PN junction exhibit leakage current and degraded breakdown voltage characteristics under particular biasing conditions. To address these problems, as shown in FIG. 1, SiGe later 110a is disposed in body region 138 a distance "a" from PN junction 137 that is formed between lower silicon layer 135a and drift region 105b, and a distance "b" from the bottom-most portion of the PN junction formed between source regions 141 and body regions 138. In high voltage transistors where PN junction 137 is reverse biased under a high reverse voltage, spacing "a" may be set such that the depletion region resulting from the high reverse voltage does not reach SiGe layer 110a. In contrast, in low voltage devices where PN junction 137 is under a lower reverse voltage, spacing "a" may be made smaller or even eliminated altogether. Spacing "a" and spacing "b" may be the same length, or spacing "a" may be greater than spacing "b", or vice versa. In one embodiment, spacing "a" and spacing "b" are selected from the range of 500 Å to 1,000 Å.

Figure 2A:
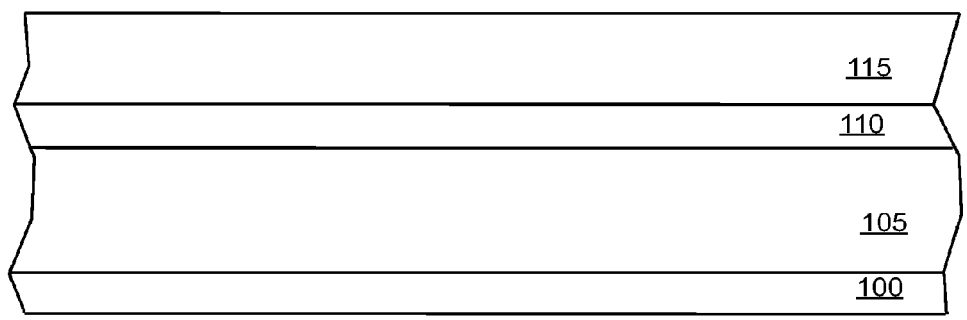
FIGS. 2A-2F are simplified cross-section views showing an exemplary method for forming the N-channel shielded gate FET shown in FIG. 1 in accordance with an embodiment of the present invention.

FIGS. 2A-2F are cross-section views showing an exemplary method for forming the N-channel shielded gate FET in FIG. 1 in accordance with an embodiment of the invention. Referring to FIG. 2A, at least one epitaxial layer such as silicon epitaxial layer 105, at least one silicon-germanium ($Si_{1-x}Ge_x$) layer such as silicon-germanium epitaxial layer 110 and at least one other epitaxial layer such as silicon epitaxial layer 115 are sequentially formed over a substrate 100. Substrate 100 can be a silicon substrate, a III-V compound substrate, a silicon/germanium (SiGe) substrate, silicon carbide substrate, an epi-substrate, or a silicon-on-insulator (SOI) substrate. In the case of an N-channel MOSFET, substrate 100 is N-type, and in the case of an N-channel IGBT, substrate 100 is P-type.

Silicon epitaxial layer 105 may be formed by a conventional epitaxial process. Silicon epitaxial layer 105 has N-type dopants such as boron, gallium, aluminum and/or other group III element. The dopant concentration of silicon epitaxial layer 105 may be lower than that of substrate 100. Silicon-germanium epitaxial layer 110 may be formed by a conventional epitaxial process. Silicon-germanium epitaxial layer 110 has P-type dopants such as boron, gallium, aluminum and/or other group III element. In some embodiments, silicon-germanium epitaxial layer 110 may have a thickness between about 100 Å and about 500 Å. Silicon epitaxial layer 115 may be formed by a conventional epitaxial process. Silicon epitaxial layer 115 has P-type dopants such as boron, gallium, aluminum and/or other group III element.

Figure 2B:
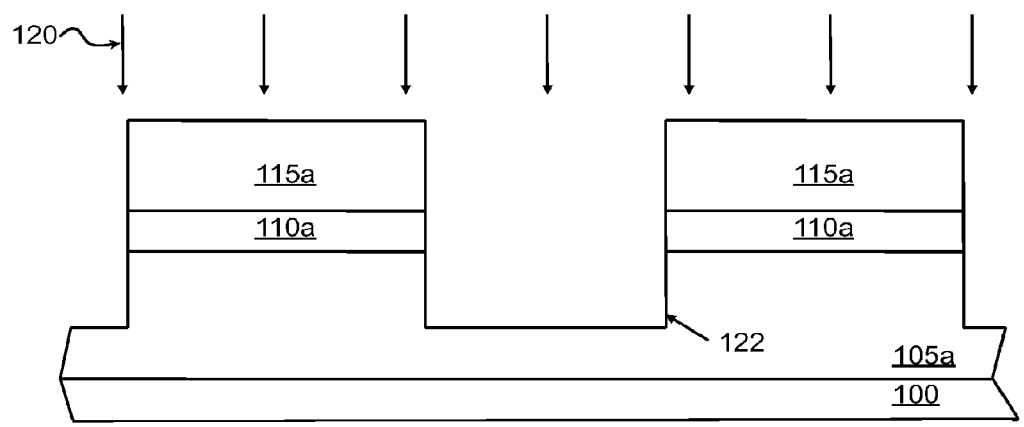

In FIG. 2B, one or more etch processes 120 may be carried out to form trenches 122 extending through epitaxial layer 115, SiGe layer 110m and epitaxial layer 105. In some embodiments, a patterned mask (not shown) with openings corresponding to trenches 122 may be formed over epitaxial layer 115. Etch process(s) 120 uses the patterned mask as an etch mask to define trenches 122. The patterned mask may be, for example, a patterned photoresist layer, a patterned dielectric layer, or any patterned material layer that can be adapted to be an etch mask. After etch process(s) 120, the patterned mask layer may be removed.

Figure 2C:
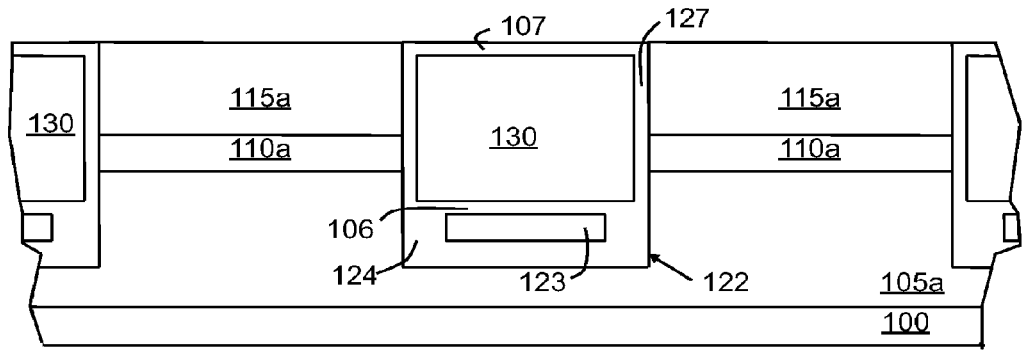

In FIG. 2C, shield dielectric 124 is formed along lower sidewalls and bottom of each trench 122 using known techniques. Shield electrodes 123 are formed in lower portions of trenches 122 using conventional methods. Gate insulator 127 is formed along upper sidewalls of trenches 122 using known techniques. In one embodiment, gate insulator 127 also extends over shield electrodes 123 to thereby form an inter-electrode dielectric (IED) 106 over shield electrodes 123. In another embodiment, an IED layer 106 that is thicker than gate dielectric 127 is formed over shield electrodes 123 in a separate step from the step of forming gate insulator 127. Recessed gate electrodes 130 are formed over IED 106 in trenches 122 using conventional techniques. Dielectric cap 107 (e.g., comprising oxide or BPSG) is formed over each gate electrode 130 using know techniques.

Shield electrodes 123 and gate electrodes 130 comprise a conductive material such as doped or undoped polysilicon, copper, aluminum copper, aluminum, tungsten, other conductive material or various combinations thereof. Each of shield dielectric 124, IED 106, and gate insulator 127 may comprise, for example, an oxide layer, a nitride layer, an oxynitride layer, other dielectric layer or various combinations thereof.

Figure 2D:
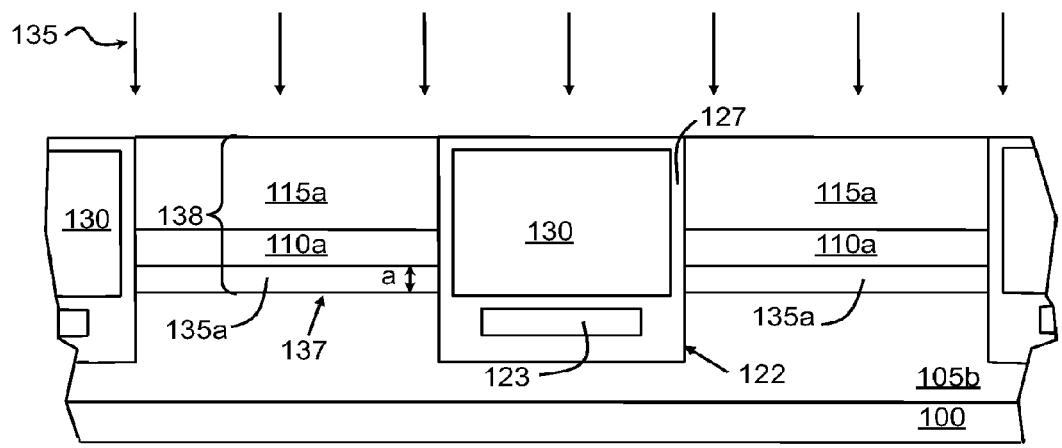

In FIG. 2D, using known techniques, implant process 135 is carried out to implant dopants that penetrate silicon-germanium layer 110*a*, thereby converting an upper portion of N-type epitaxial layer 105 into P-type region 135*a*. P-type dopants such as boron, aluminum and/or other group III elements may be used in implant process 135. Upper silicon region 115*a*, middle SiGe layer 110*a*, and lower silicon layer 135*a* are all P-type and together form body region 138. Body region 138 forms a PN junction 137 with drift region 105*b* (i.e., the portion of epitaxial layer 105*a* that is bounded by body region 138 and substrate 100). As discussed above in connection with FIG. 1, depending on various considerations, a smaller or larger spacing "a" may be desirable, and implantation process 135 may be designed accordingly. In one embodiment, spacing "a" is set to a value selected from the range of 500 Å to 1,000 Å.

In one embodiment, implant process 135 is performed without a patterned mask layer. In other embodiments, implant process 135 is performed with a patterned mask layer having a pattern substantially covering gate electrodes 130. Such patterned mask may be, for example, a patterned photoresist layer, or a patterned dielectric layer. After implantation process 135, the patterned mask layer may be removed. In yet some other embodiments, implant process 135 may be carried out prior to forming trenches 122.

In an alternate embodiment, lower silicon layer 135*a* is formed epitaxially rather than by implantation of dopants. That is, in the process steps depicted in FIG. 2A, a P-type silicon epitaxial layer 135*a* can be formed between N-type silicon epitaxial layer 105 and SiGe layer 110. In yet another embodiment, silicon layer 135*a* is formed as follows. In FIG. 2A, after forming N-type epitaxial layer 105 and before forming SiGe layer, P-type dopants are implanted into epitaxial layer 105 to thereby convert an upper region of N-type epitaxial layer 105 into P-type layer 135*a*.

Figure 2E:
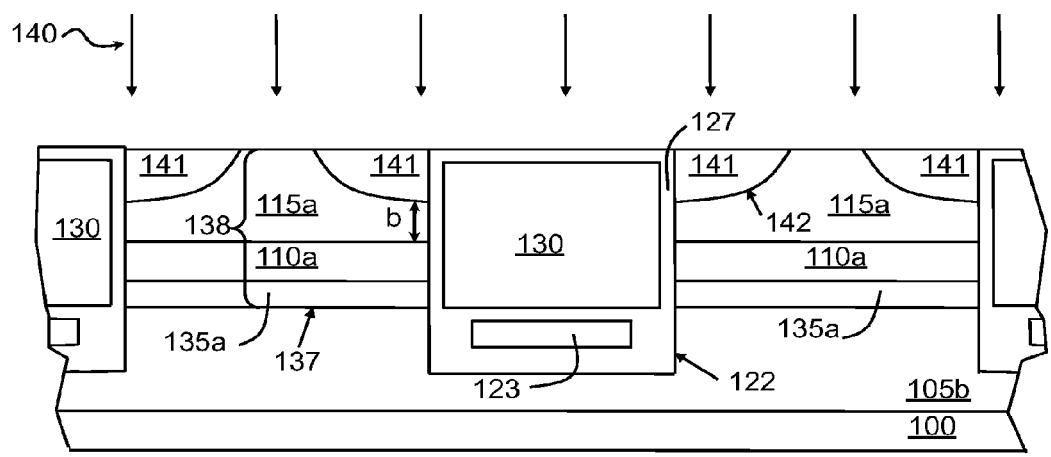

Referring to FIG. 2E, implant process 140 is carried out to form highly doped source regions 141 in upper silicon layer 115*a* adjacent trenches 122. N-type dopants such as phosphorus, arsenic and/or other group V elements may be used in implant process 140. In one embodiment, a patterned mask layer (not shown) having a pattern exposing surfaces of epitaxial layer 115*a* through which the dopants are to be implanted may be used. The patterned mask may be, for example, a patterned photoresist layer, a patterned dielectric layer, or various combinations thereof. After implant process 140, the patterned mask layer may be removed.

As stated above in connection with FIG. 1, various process parameters and layer thicknesses may be adjusted so that a distance "b" between SiGe layer 110*a* to the bottom-most portion of source regions 141 is set to a value which insures that silicon germanium layer 110*a* does not reach the PN junction formed between source regions 141 and upper silicon layer 115*a*. In one embodiment, spacing "b" is selected from the range of about 500 Å and about 1,000 Å. In one embodiment, SiGe layer 110 is extended all the way up to source regions 141.

Figure 2F:
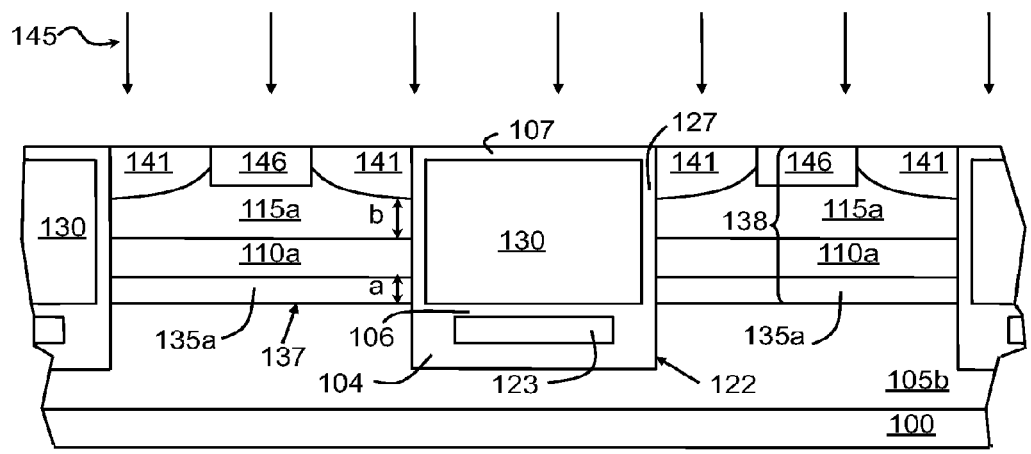

In FIG. 2F, a further implant process 145 is carried out to form heavy body regions 146 within upper silicon layer 115*a* between adjacent source regions 141. P-type dopants such as boron, aluminum and/or other group III element may be used in implant process 145. In one embodiment, implant process 145 is performed with a patterned mask layer (not shown) having a pattern exposing predefined surfaces of upper silicon layer 115*a* through which the dopants are to be implanted. The patterned mask may be, for example, a patterned photoresist layer or a patterned dielectric layer. After implant process 145, the patterned mask layer may be removed. As can be seen, the top surface of mesa regions (i.e., semiconductor regions between adjacent trenches) and the top surface of dielectric cap 107 are substantially coplanar. In an alternate embodiment, using know techniques, dielectric cap 107 may be formed to have a dome shape and extend out of each trench to overlap the adjacent mesa regions.

Using known techniques, a top-side interconnect layer (not shown) is formed on the top-side of the structure to electrically contact source regions 141 and heavy body regions 146. A back-side interconnect layer (not shown) is formed on the back-side of the structure to electrically contact substrate 100. The top-side and back-side interconnect layers may comprise a metal.

Figure 3A:
FIGS. 3A-3F are simplified cross-section views showing another exemplary method for forming the N-channel shielded gate FET shown in FIG. 1, in accordance with another embodiment of the invention.
Figure 3B:
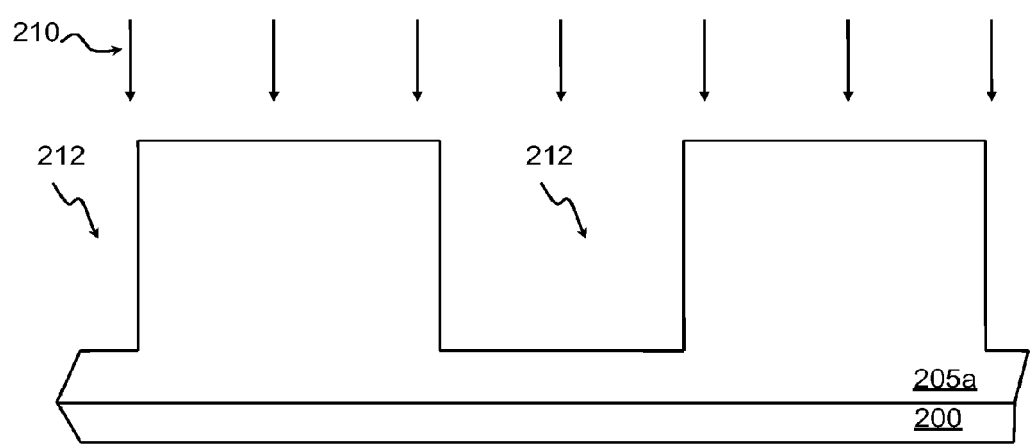
Figure 3C:
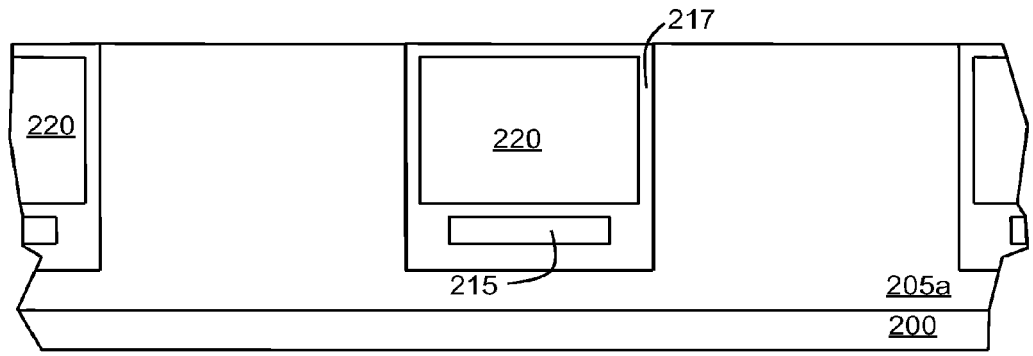

FIGS. 3A-3F are cross-section views showing another exemplary method for forming the shielded gate N-channel FET shown in FIG. 1, in accordance with another embodiment of the invention. In FIG. 3A, a silicon epitaxial layer 205 is formed over a substrate 200. Substrate 200 and epitaxial layer 205 may respectively be similar to substrate 100 and epitaxial layer 105 described above in conjunction with FIG. 1A. In FIG. 3B, trenches 212 are formed in epitaxial layer 205 in a similar manner to trenches 112 in FIG. 2B. In FIG. 3C, the shield dielectric, shield electrodes 215, the IED, gate insulator 217, the dielectric cap over gate electrode 220, gate electrodes 220 and other trench structures are formed similar to those described above in connection with FIG. 2C.

Figure 3D:
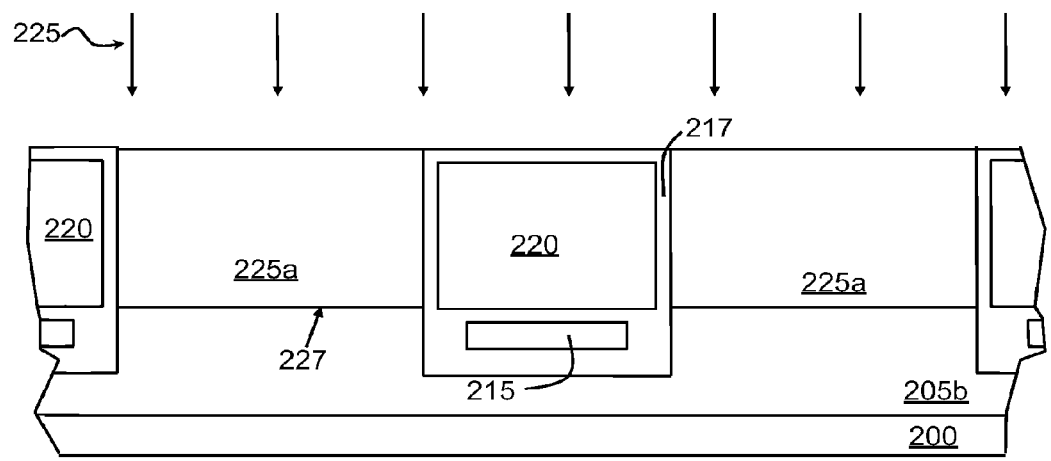

In FIG. 3D, an implant process 225 is carried out to implant P-type dopants into the mesa regions between adjacent trenches so as to form body regions 225*a* in epitaxial layer 205*a*. A PN junction is thus formed at interfaces 227 between body regions 225*a* and epitaxial layer 205*b*. In some embodiments, implant process 225 uses p-type dopants such as boron, aluminum and/or other group III element. In some embodiment, implant process 225 is performed without a patterned mask layer. In other embodiments, implant process 225 is performed with a patterned mask layer having a pattern covering gates 220. The patterned mask may be, for example, a patterned photoresist layer or a patterned dielectric layer. After implant process 225, the patterned mask layer may be removed.

Figure 3E:
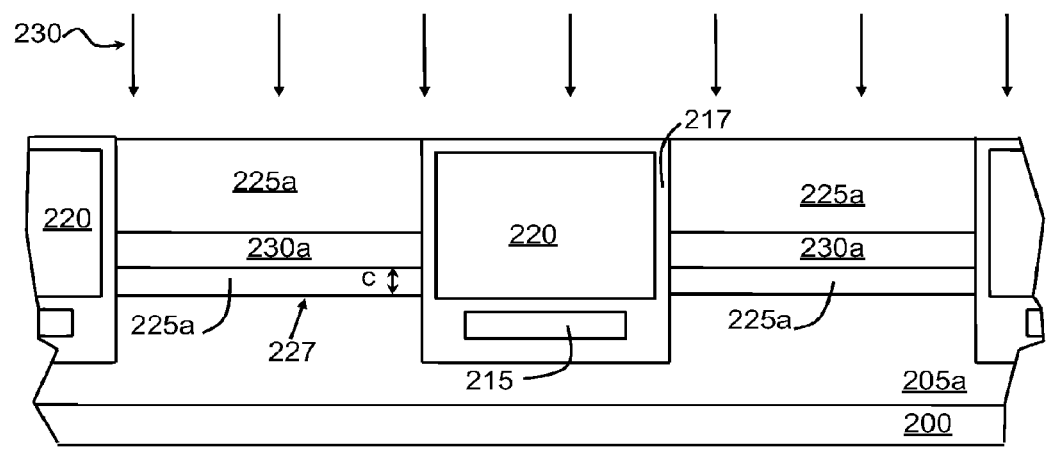

In FIG. 3E, an implant process 230 implants germanium dopants into body regions 225*a* so as to form silicon-germanium layer 230*a* embedded within body regions 225*a*. In some embodiments, implant process 230 is designed so that SiGe layer 230*a* is spaced a distance "c" from interface 227. The considerations in selecting a value for distance "c" would be similar to those for distance "a" in FIG. 2F. In some embodiments, SiGe layer 230*a* may have a thickness between about 100 Å and about 500 Å. In some embodiments, implant process 230 is performed without a patterned mask layer. In other embodiments, implant process 230 is performed with a patterned mask layer having a pattern covering gate electrodes 220. In one embodiment, the patterned mask layer is the same mask layer used in implant process 225 in FIG. 3D.

Figure 3F:
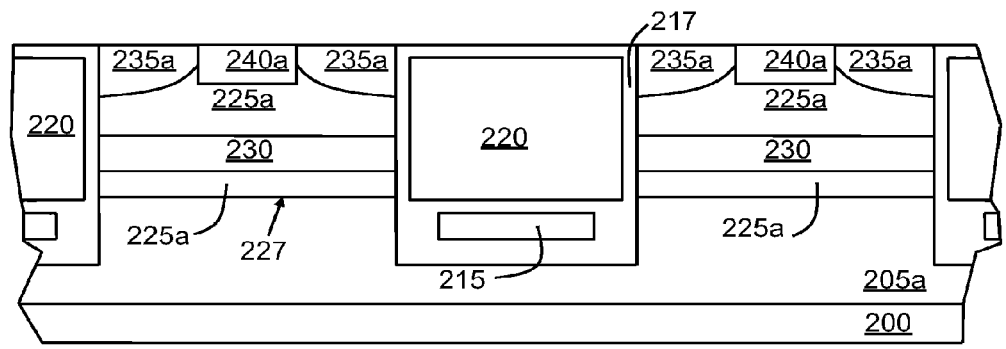

In FIG. 3F, the processes for forming source regions 235*a* and heavy body regions 240*a* are similar to those in FIGS. 2E and 2F and thus will not be described. In an alternate embodiment, implantation processes 225, 230 and those for source and heavy body regions may be performed before the formation of trenches 212.

Figure 4:
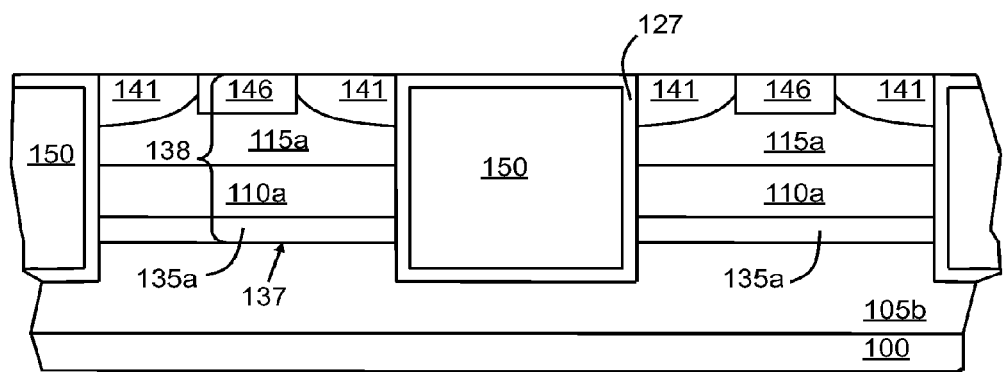
FIG. 4 is a simplified cross-section view of an exemplary N-channel trench gate FET with a SiGe layer embedded in the body region in accordance with an embodiment of the present invention.

The above-described techniques of embedding a SiGe layer in the body region in a manner that reduces the channel resistance is not limited in application to shielded gate FETs. FIG. 4 shows a cross-sectional view of an exemplary N-channel trench gate transistor with a SiGe layer embedded in the body region in accordance with an embodiment of the present invention. The trench gate FET in FIG. 4 is similar to the shielded gate FET in FIG. 1 except that the trenches do not extend as deep and the shield electrodes are absent. That is, substrate 100, drift region 105b, body region 138 and its three sub-layers 135a, 110a and 115a, source regions 141 and heavy body regions 146 are all similar to their corresponding regions in the shielded gate FET shown in FIG. 1. However, the trench structure in FIG. 4 includes only a gate electrode 150 and dielectric layers insulating gate electrode 150 from surrounding regions.

Any one of the process techniques and their variations described above in connection with FIGS. 2A-2F and 3A-3F can be used, with some modification, to form the transistor in FIG. 4. The required process changes relating to forming the trenches and their inner elements would be obvious to one skilled in the art in view of this disclosure. For example, the trenches need not extend as deep, and the steps related to forming the shield dielectric and the shield electrode are eliminated. Although FIG. 4 shows gate dielectric layer 127 along the trench sidewalls to have the same thickness as the dielectric layer along the trench bottoms, in one variation, a thicker dielectric layer (commonly referred to as thick bottom dielectric—TBD) is formed along the bottom of the trenches below gate electrodes 150 to reduce the gate to drain capacitance.

Figure 5:
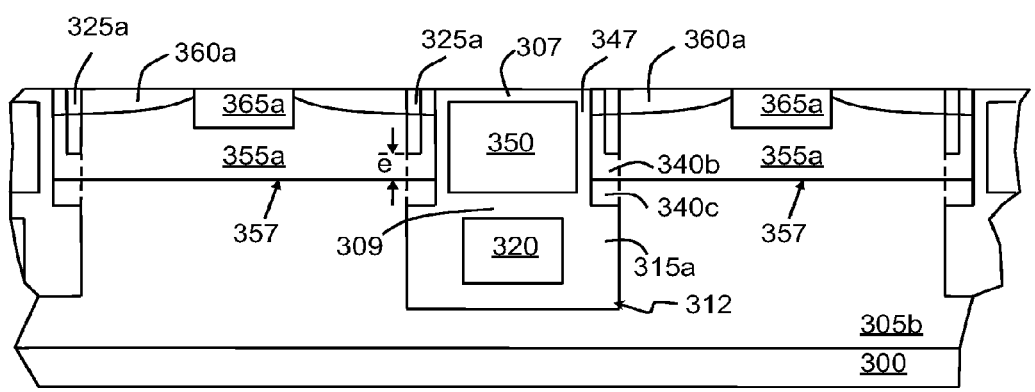
FIG. 5 is a simplified cross-section view of a P-channel shielded gate FET with a SiGe layer extending in the channel region, in accordance with an embodiment of the present invention.

FIG. 5 is a simplified cross-section view of a P-channel shielded gate FET with a SiGe layer that extends into the channel region, in accordance with an embodiment of the present invention. The FET includes a highly doped substrate 300. Substrate 300 may be P-type in the case of a P-channel MOSFET or N-type in the case of a P-channel IGBT. Lightly doped P-type drift region 305b extends over substrate 300. N-type body region 355a extends over drift region 305b. Trenches 312 extend through body region 335a and terminate within drift region 305b. In an alternate embodiment, trenches 312 extend deeper and terminate within substrate 300. The vertical dashed lines are included in FIG. 5 only to show the contours of trenches 312 when it is originally formed. Silicon regions 340b and 340c partially fill trenches 312 as will be described more fully further below in connection with the process flow depicted by FIGS. 6A-6J.

Shield dielectric 315a (e.g., comprising one or both of oxide and nitride layers) lines lower sidewalls and bottom of each trench 312. Shield electrode 320 (e.g., comprising doped or undoped polysilicon) fills a lower portion of each trench 312. Shield dielectric 315a insulates shield electrode 320 from drift region 305b. The shape of shield electrodes 123 as shown in FIG. 1 is strictly illustrative. In an actual device, shield electrodes 320 may extend longer along the vertical dimension than along the lateral dimension.

Inter-electrode dielectric 306s (e.g., comprising one or more oxide layers) laterally extends over shield electrode 320. Gate dielectric 347 (e.g., comprising gate oxide) lines upper trench sidewalls. Recessed gate electrode 350 (e.g., comprising doped or undoped polysilicon) fills an upper portion of each trench 312. Inter-electrode dielectric (IED) 309 insulates the gate and shield electrodes from one anther. In one embodiment, IED 309 and gate dielectric 347 are of substantially the same thickness. In another embodiment, IED 309 and shield dielectric 315a are both thicker than gate dielectric 347. Dielectric cap 307 (e.g., comprising oxide and/or BPSG) extends over gate electrode 350. Highly doped P-type source regions 360a are in body region 355a adjacent trenches 312. Highly doped N-type heavy body regions 365a are in body region 355a between adjacent source regions 360a.

SiGe strips 325a vertically extends through each source regions 360a and into body regions 355a. The portion of SiGe layer 325a that extends in body region 355a is N-type, and the portion of SiGe layer 325a that extends in source region 360a is P-type. Silicon regions 340b are N-type and extend vertically between SiGe strips 325a and the trench sidewalls and below the bottom-end of SiGe strips 325a. Silicon regions 340b together with SiGe strips 325a form the channel regions. Silicon region 340c is P-type and forms part of drift region 305b.

A top-side interconnect layer (not shown) extends along the top-side of the structure and electrically contacts source regions 360a and heavy body regions 365a. A bottom-side interconnect layer (not shown) extends along the bottom-side of the structure to electrically contact substrate 300. In one embodiment, the top-side and bottom-side interconnect layers comprise a metal. Dielectric cap 307 insulates gate electrodes 350 form the top-side interconnect layer. In an alternate embodiment, dielectric cap 307 has a dome shape and extends out of each trench to laterally overlap source regions 360a.

When the FET is turned on a channel is formed in body region 355a along each trench sidewall between source regions 360a and drift region 305b. The channel region includes SiGe strip 25a which is laterally sandwiched between two silicon regions. When the FET is turned on, holes travel through the channel region but away from the gate dielectric interface. However, SiGe strips 325a substantially reduce scattering of the holes in the channel region and thus reduce the channel resistance. The lower channel resistance in turn reduces the transistor Rdson as compared to prior art structures where no SiGe layer extends into the channel region.

Further, similar to prior embodiments, by maintaining a spacing "e" between SiGe strips 325a and the PN junction 357 between body regions 355a and drift region 305b, the leakage current and degraded breakdown voltage characteristics that would otherwise be present are eliminated. In one embodiment, spacing "e" is set so that a depletion region formed when junction 357 is under a reverse voltage does not reach SiGe strips 325a. In one embodiment, spacing "e" is selected from the range of 500-5000 ÅA. In another embodiment, SiGe strips 325a have a thickness in the range of 100 Å to 500 Å.

Figure 6A:
FIGS. 6A-6J are simplified cross-section views showing an exemplary method for forming the P-channel shielded gate FET shown in FIG. 5 in accordance with an embodiment of the present invention.

FIGS. 6A-6J are simplified cross-section views showing an exemplary method for forming the P-channel shielded gate FET shown in FIG. 5 in accordance with an embodiment of the present invention. In FIG. 6A, P-type silicon epitaxial layer 305 is formed over a heavily doped substrate 300. In the case of a P-channel MOSFET, substrate 300 is P-type, and in the case of a P-channel IGBT, substrate 300 is N-type. Silicon epitaxial layer 305 may be formed by a conventional epitaxial process, and may have a lower doping concentration than that of substrate 300.

Figure 6B:
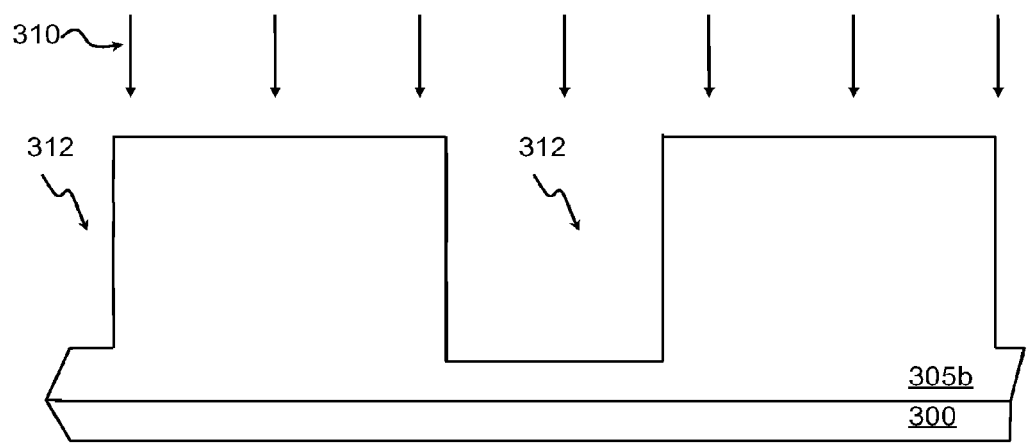
Figure 6C:
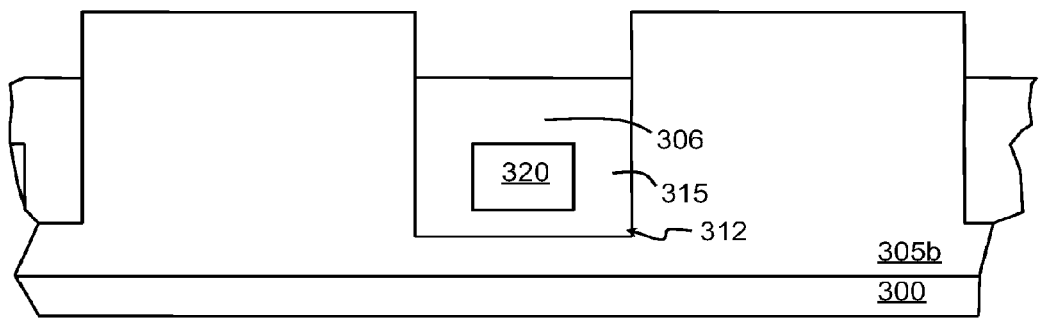

In FIG. 6B, a silicon etch process 310 similar to that described above in connection with FIG. 3B may be carried out to form trenches 312 in epitaxial layer 305. In FIG. 6C, shield dielectric 315 and shield electrodes 320 are formed in trenches 312 in a similar manner to those described above in connection with FIG. 3C. A thick dielectric layer 306 is formed over shield electrodes 320 to a predetermined thickness. As will be seen from the subsequent process steps, the upper surface of dielectric layer 306 defines the depth within the channel regions to which the SiGe strips extends.

Figure 6D:
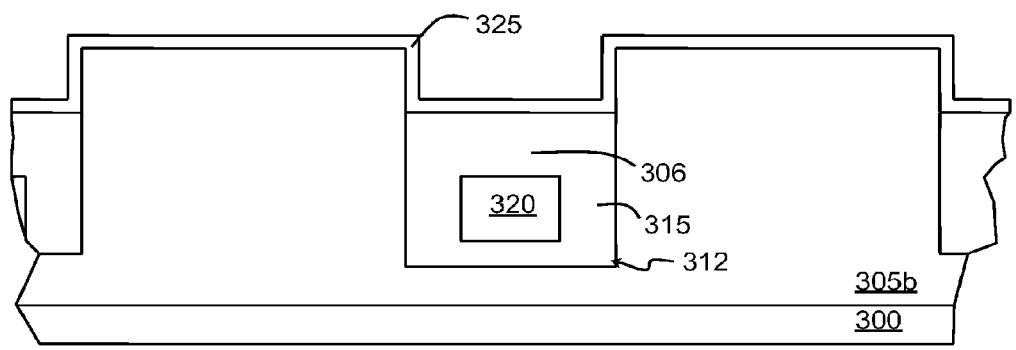

In FIG. 6D, SiGe layer 325 is formed over the mesa regions between adjacent trenches, along the exposed upper trench sidewalls, and over dielectric layer 306. SiGe layer 325 may be in-situ doped with N-type dopant. In some embodiments, SiGe 325 may be formed by, for example, an epitaxial process, a chemical vapor deposition (CVD) process, an ultra high vacuum chemical vapor deposition (UHVCVD) process, an atomic layer chemical vapor deposition (ALCVD) process, a metal organic chemical vapor deposition (MOCVD) process or other CVD processes. In some embodiments, SiGe layer 325 may have a thickness between about 100 Å and about 500 Å.

Figure 6E:
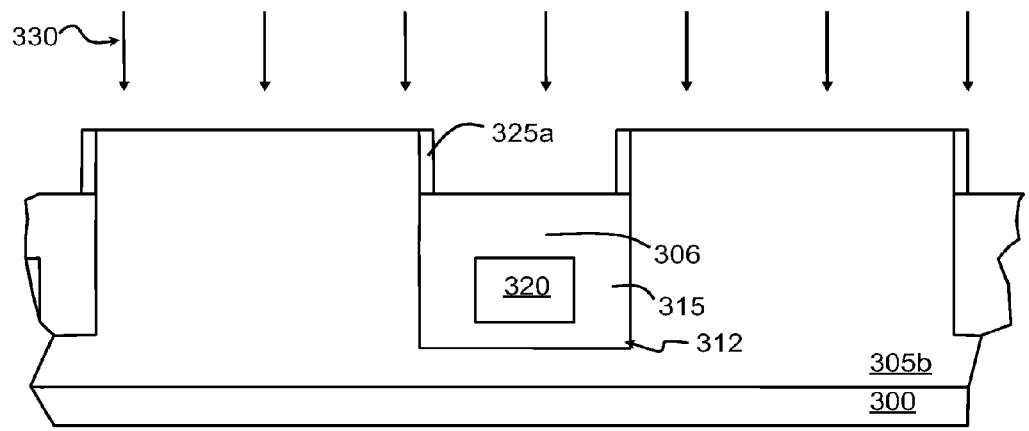
Figure 6F:
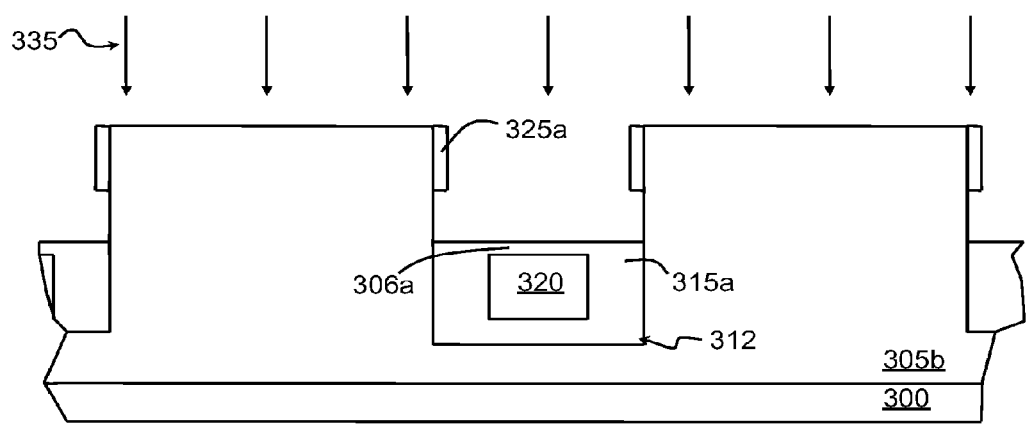

In FIG. 6E, an etch process 330 may be carried out to remove horizontally extending portions of SiGe layer 325, leaving SiGe strips 325a along upper trench sidewalls. In some embodiments, etch process 330 may be a dry etch process and/or a wet etch process. In FIG. 6F, an etch process 335 may be carried out to remove a portion of dielectric layers 306 thereby forming a gap between SiGe strips 325a and a remaining dielectric portion 306a. Etch process 335 may be a wet etch process and/or a dry etch process.

Figure 6G:
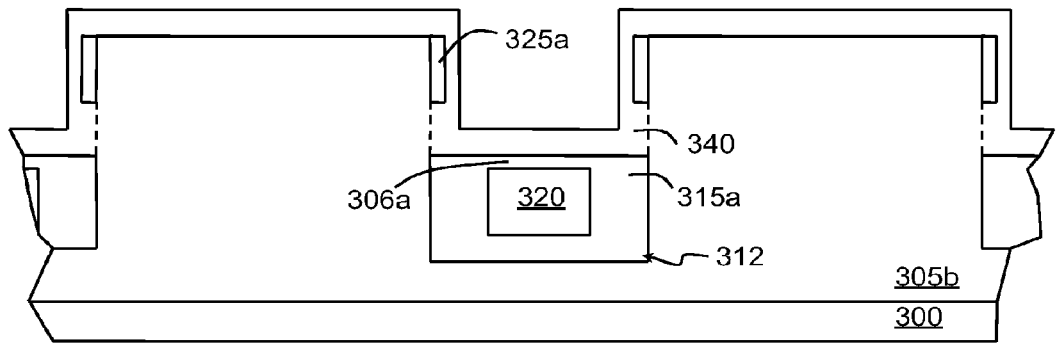

In FIG. 6G, silicon layer 340 is formed over the entire structure. Silicon layer 340 may be doped P-type so as to have the same conductivity type as epitaxial layer 305a. The vertical dashed lines indicate the original contour of trenches 312. Silicon layer 340 may be formed by, for example, an epitaxial process, a chemical vapor deposition (CVD) process, an ultra high vacuum chemical vapor deposition (UHVCVD) process, an atomic layer chemical vapor deposition (ALCVD) process, a metal organic chemical vapor deposition (MOCVD) process or other CVD process.

Figure 6H:
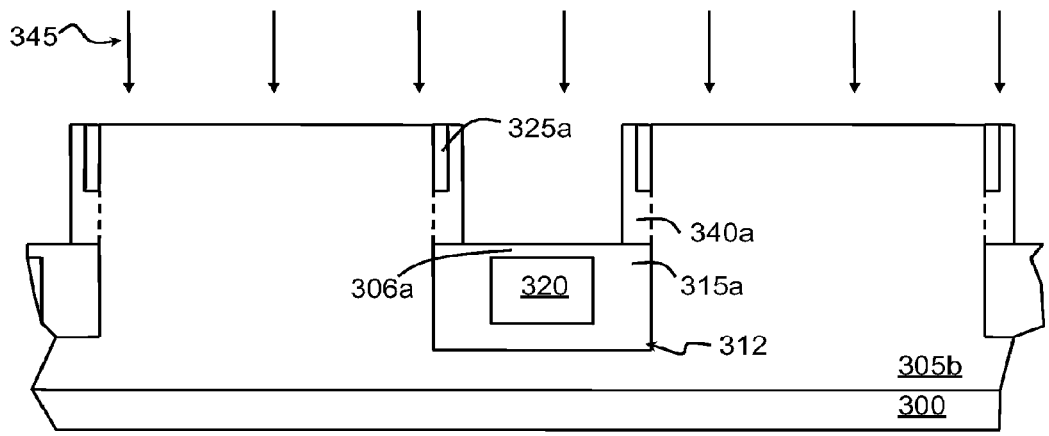

In FIG. 6H, etch process 345 is carried out to remove horizontally extending portions of the silicon layer 340 while preserving vertically portions 340a. Etch process 345 may be a dry etch process and/or a wet etch process, and may use dielectric portion 360a as etch stop. This prevents over etching of the mesa regions between adjacent trenches.

Figure 6I:
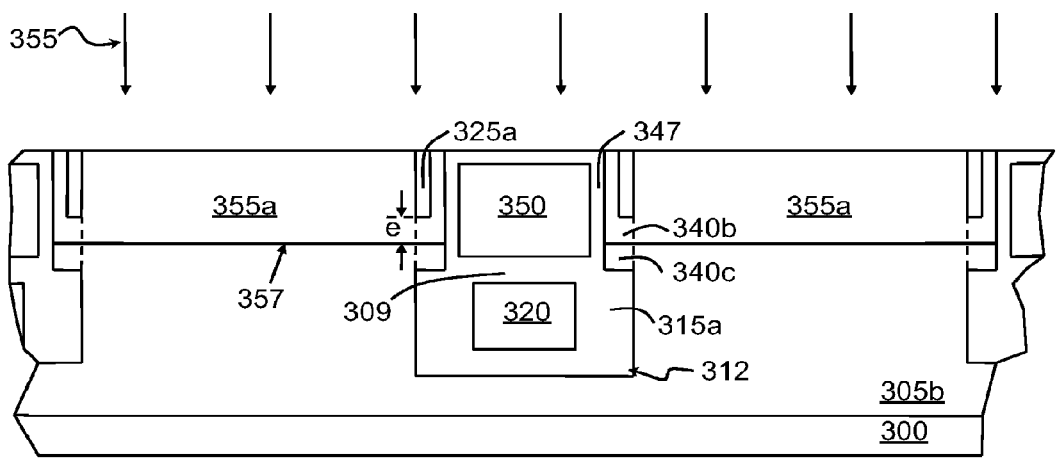

In FIG. 6I, gate dielectric 347 (e.g., comprising oxide) lining sidewalls of silicon regions 340a are formed. Gate dielectric 347 may be formed to also extend over dielectric portion 306a to thereby form a thicker inter-electrode dielectric (IED) layer 309. Alternatively, prior to forming gate dielectric 347, a laterally-extending layer of dielectric (e.g., comprising oxide) may be formed over dielectric portion 306a to obtain an inter-electrode dielectric 309 with the desired thickness. Gate electrodes 350 are formed over IED 309 in a similar manner to those in prior embodiments.

A conventional body implant 355 may be carried out to form N-type body regions 355a in epitaxial layer 305b. Note that body implant 355 converts an upper portion 340b of silicon region 340a into N-type silicon, while a lower portion 340c remains P-type. Body implant 355 may be carried out at an earlier stage (e.g., before forming gate electrode 350 or even before forming trenches 312) if desired. As can be seen, vertically extending SiGe strips 325a are vertically sandwiched by silicon regions 340b and 355a, and are advantageously spaced from PN junction 357 by a spacing "e." In one embodiment, spacing "e" selected from the range of about 500 Å to 1,000 Å.

Figure 6J:
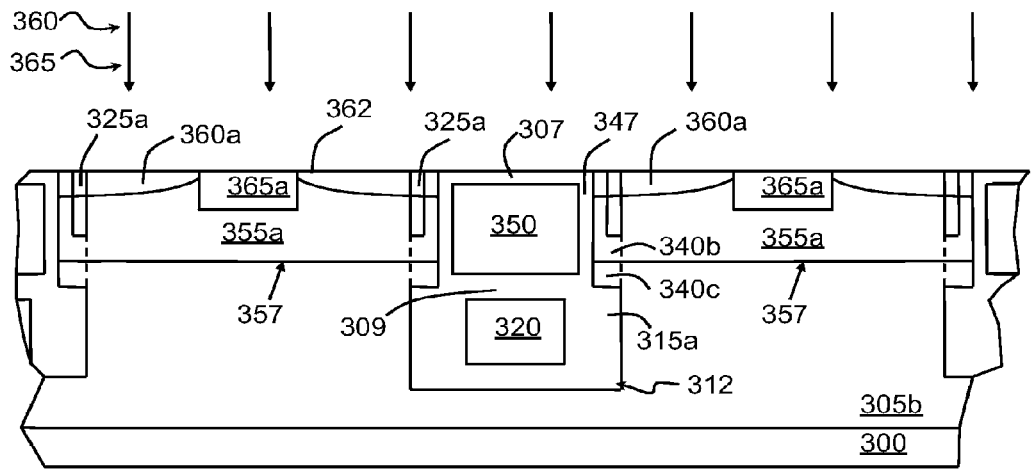

Referring to FIG. 6J, a conventional source implant 360 is carried out to form highly doped P-type source regions 360a flanking trenches 312. Note that source implant 360 converts an upper portion of silicon region 340b to P-type. Next, a conventional heavy body implant 365 is carried out to form highly doped N-type heavy body regions 365a between adjacent source regions 360a. The various considerations discussed above in connection with forming the source and heavy body regions of the above embodiments also apply to present embodiment. The top-side and bottom-side interconnect layers (not shown) may be formed in a similar manner to prior embodiments.

Figure 7:
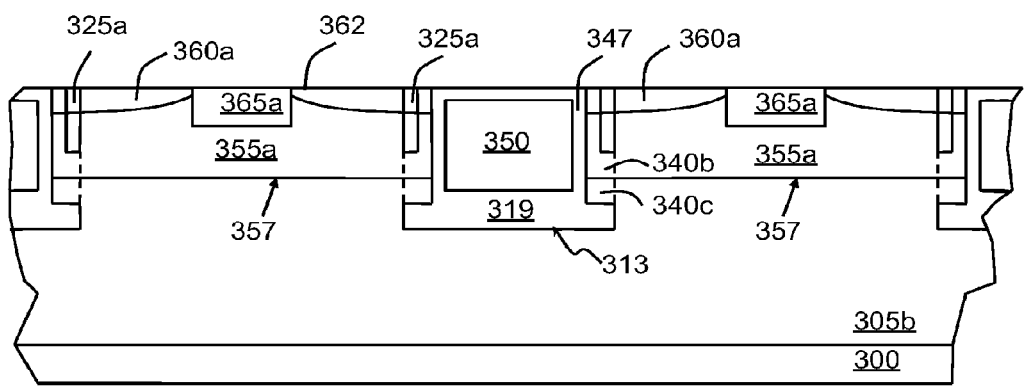
FIG. 7 is a simplified cross-section view of an exemplary N-channel trench gate FET with a SiGe layer extending into the channel region in accordance with an embodiment of the present invention.

FIG. 7 shows a cross-section view of an exemplary P-channel trench gate FET with a SiGe strip extending into the channel region in accordance with an embodiment of the present invention. The trench gate FET in FIG. 7 is similar to the shielded gate FET in FIG. 5 except that the trenches do not extend as deep and the shield electrodes are removed. That is, substrate 300, drift region 305b, body region 355a, SiGe strips 325a, silicon regions 340b and 340c, source regions 360a, and heavy body regions 365a are all similar to their corresponding regions in the shielded gate FET shown in FIG. 5. However, the trench structure in FIG. 7 includes only a gate electrode 350 and dielectric layers insulating gate electrode 350 from the surrounding regions. Note that a thick bottom dielectric 319 is optionally disposed along the bottom of each trench to reduce the gate to drain capacitance.

Figure 8A:
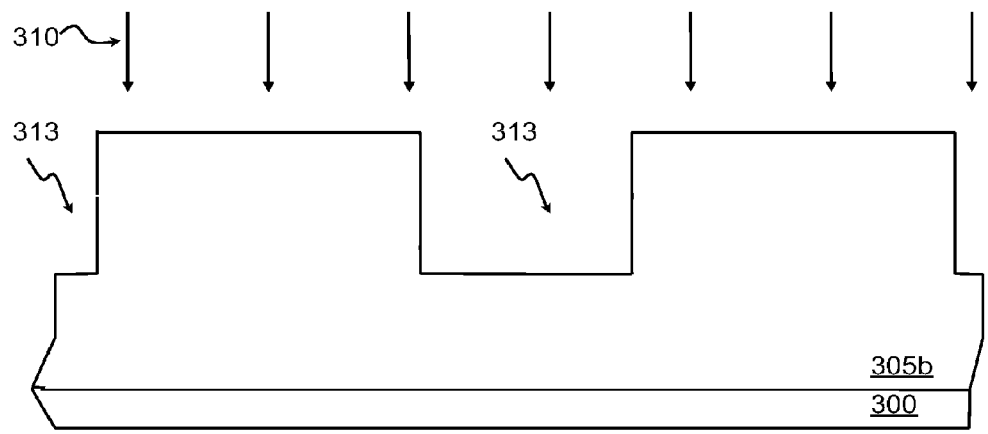
FIGS. 8A-8I are simplified cross section views showing an exemplary method for forming the P-channel trench gate FET shown in FIG. 7.
Figure 8B:
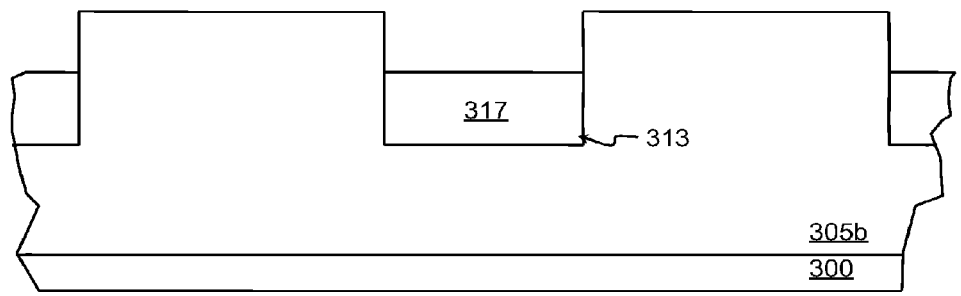
Figure 8C:
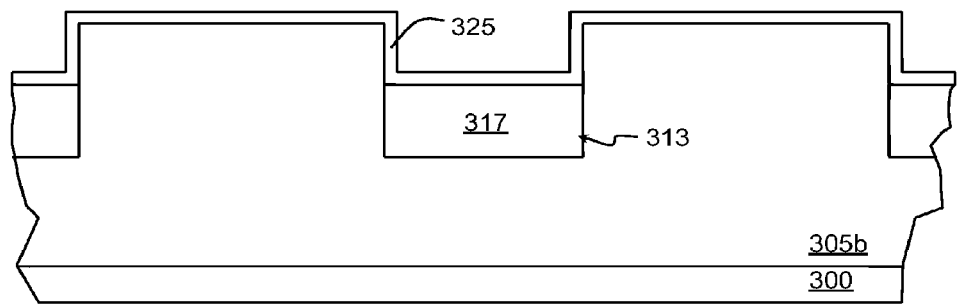
Figure 8D:
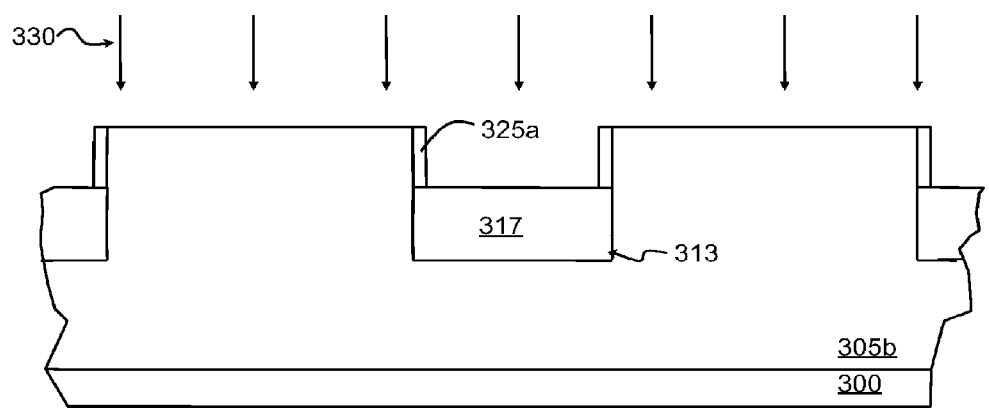
Figure 8E:
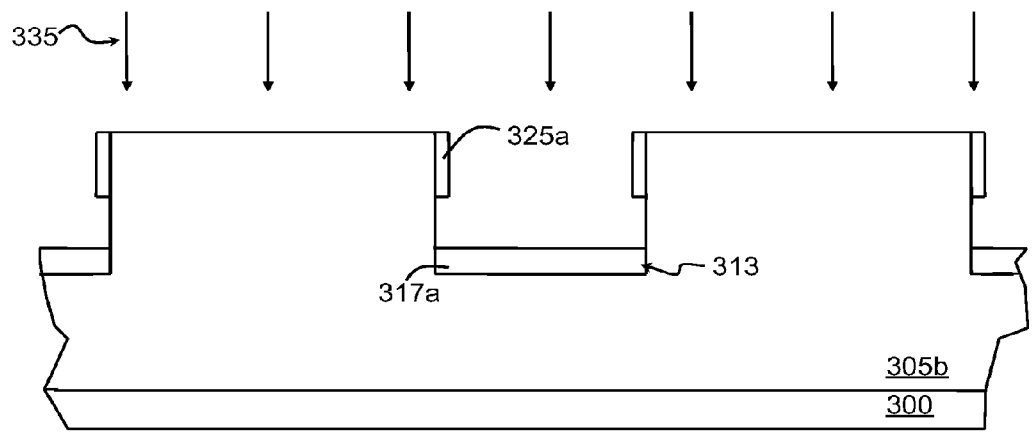
Figure 8F:
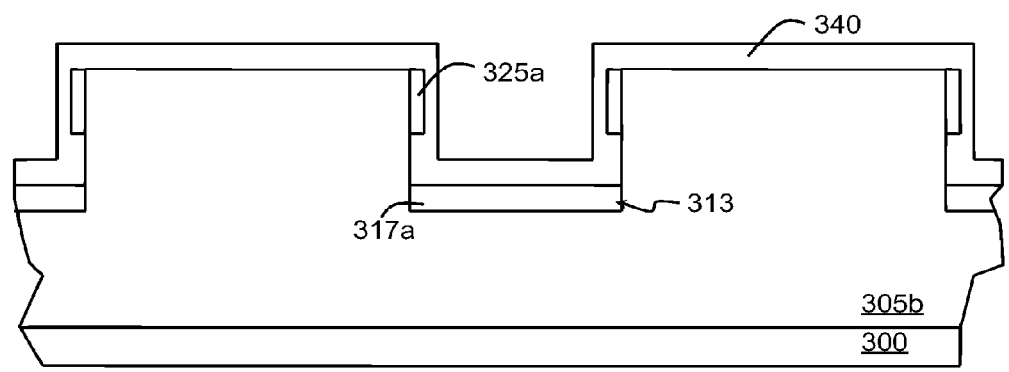
Figure 8G:
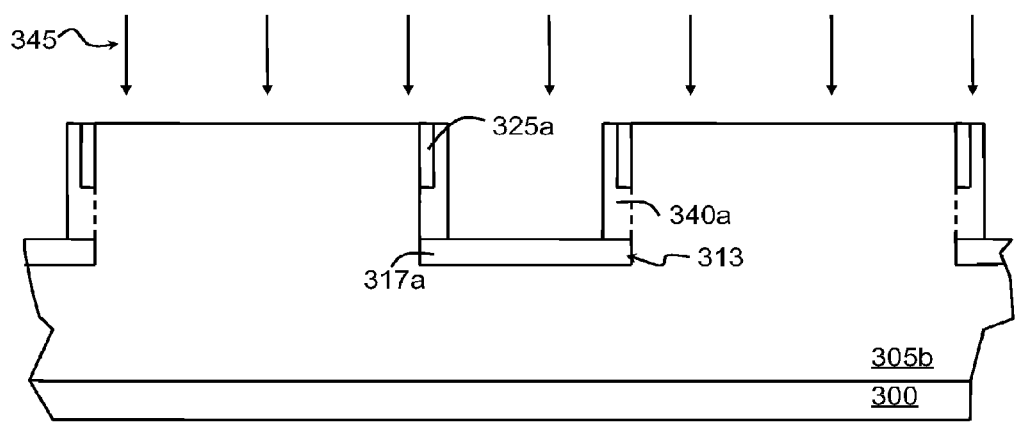

FIGS. 8A-8I are simplified cross section views at various stages of an exemplary process for forming the P-channel trench gate FET shown in FIG. 7. In FIG. 8A, trenches 313 are formed in P-type epitaxial layer 305b in a similar manner to trenches 312 in FIG. 6B except that trenches 313 do not extend as deep as trenches 312. In FIG. 8B, a thick dielectric layer 317 (e.g., comprising oxide) filling a bottom portion of trenches 313 is formed using known techniques. As will be seen in subsequent steps, the upper surface of dielectric layer 317 defines the depth within the channel regions to which the SiGe strips extends. The steps depicted in FIGS. 8C and 8D for forming SiGe strips 325a are similar to those depicted in FIGS. 6D-6E, and thus will not be described. In FIG. 8E, dielectric layer 317 in each trench 313 is recessed to a predetermined depth using known techniques. Dielectric portion 317a thus remains. The steps depicted in FIGS. 8F and 8G for forming N-type silicon regions 340a are similar to those depicted in FIGS. 6G-6H, and thus will not be described.

Figure 8H:
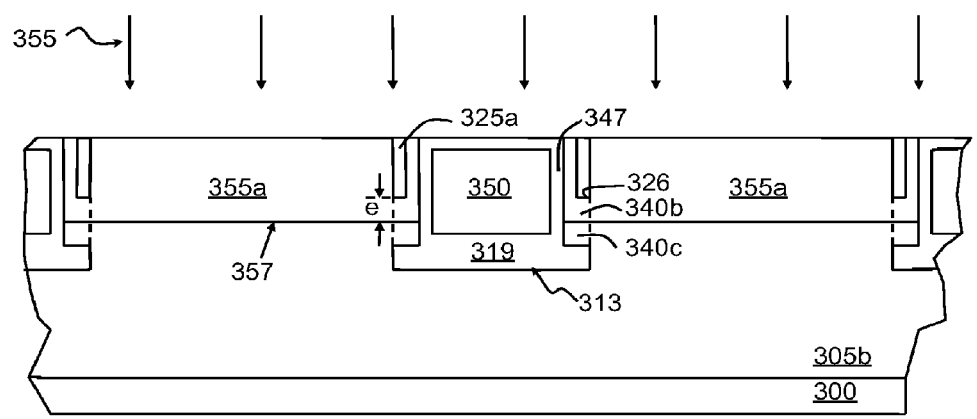
Figure 8I:
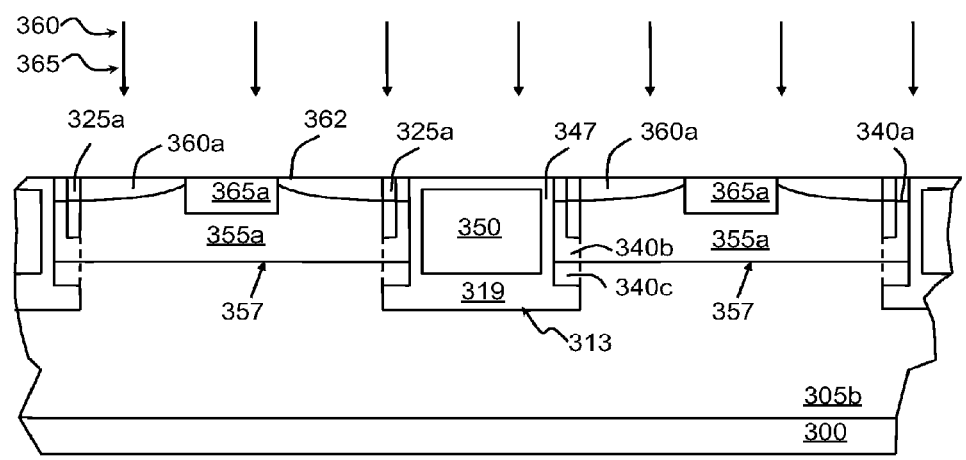

In FIG. 8H, gate dielectric 347 (e.g., comprising oxide) lining sidewalls of silicon regions 340a are formed. Gate dielectric 347 may be formed to also extend over dielectric portion 317a to thereby form a thicker bottom dielectric 319. Alternatively, prior to forming gate dielectric 347, a layer of dielectric (e.g., comprising oxide) may be formed over dielectric portion 317a to obtain a bottom dielectric 319 with the desired thickness. Gate electrode 350 is formed over thick bottom dielectric 319 in a similar manner to prior embodiments and may have similar properties to the gate electrodes of prior embodiments. Thick bottom dielectric 319 helps reduce the gate to drain capacitance and thus improves the switching performance of the FET. The steps depicted in FIG. 8I for forming source regions 360a and heavy body regions 365a are similar to those in FIG. 6J and thus will not be described.

Figure 9A:
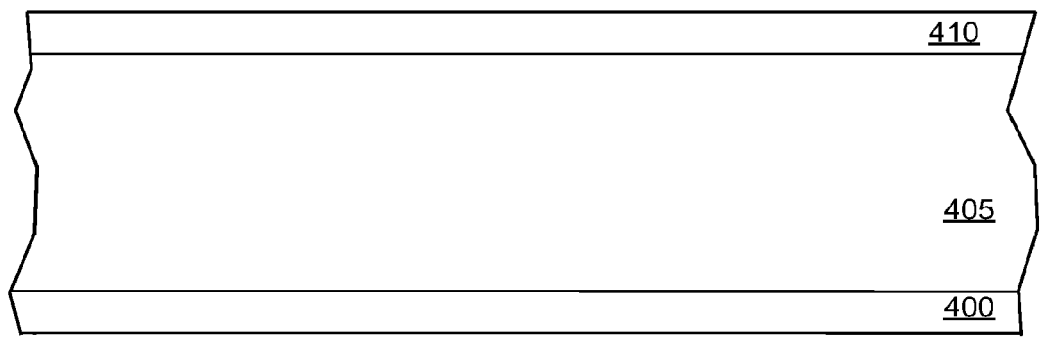
FIGS. 9A-9E are simplified cross-section views showing an exemplary method for forming a planar gate N-channel FET with a low resistance channel region in accordance with an embodiment of the present invention.

FIGS. 9A-9E are cross-section views showing an exemplary method for forming a planar gate N-channel field effect transistor with a low resistance channel region in accordance with an embodiment of the present invention. In FIG. 9A, N-type silicon epitaxial layer 405 is formed over highly doped substrate 400. In the case where the FET is an N-channel MOSFET, substrate 400 is N-type, and in the case where the FET is an N-channel IGBT, substrate 400 is P-type. In some embodiments, the materials and methods for forming silicon epitaxial layer 405 and substrate 400 are similar to those of silicon epitaxial layer 105 and substrate 100, respectively, described above in connection to FIG. 1A.

SiGe layer 410 is formed over silicon epitaxial layer 405. In some embodiments, SiGe layer 410 is a SiGe epitaxial layer. The materials and methods for forming silicon-germanium layer 410 may be similar to SiGe layer 110 described above in connection with FIG. 1A. In other embodiments, SiGe layer 410 may be formed by an implant process. The implant process may be similar to implant process 230 for forming SiGe layer 230a described above in connection with FIG. 3E.

Figure 9B:
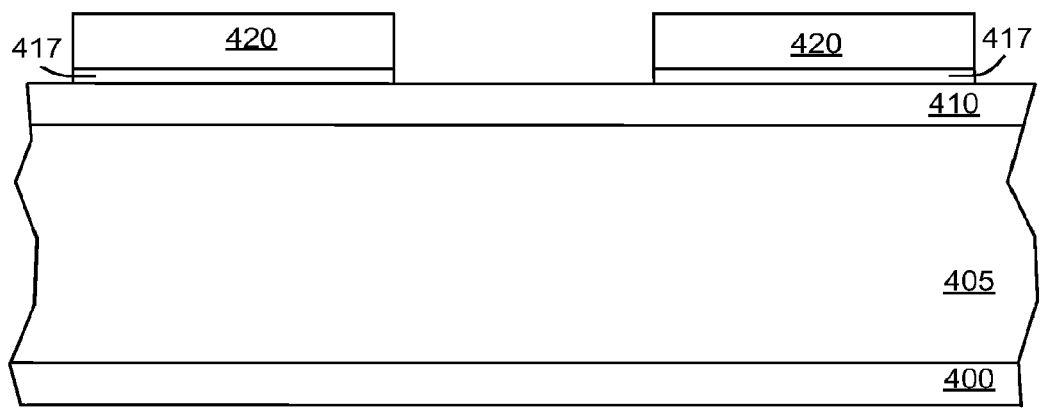

In FIG. 9B, stacks of gate dielectric 417 and gate electrode 420 are formed over SiGe layer 410 using conventional masking techniques. Gate dielectric 417 may comprise, for example, oxide, nitride, oxynitride, high-k dielectric material or various combinations thereof. Gate electrodes 420 may comprise, for example, dope or undoped polysilicon, amorphous silicon, copper, aluminum, tungsten, silicide or various combinations thereof. Gates electrodes 420 are insulated from SiGe layer 410 by gate dielectric 417.

Figure 9C:
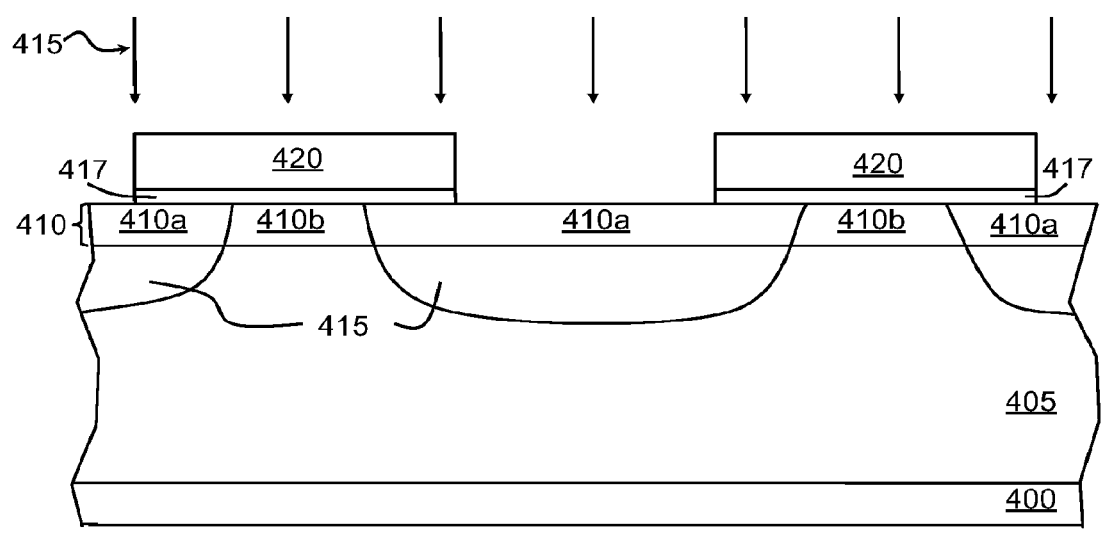

In FIG. 9C, a body implant 415 and drive-in are carried out to form P-type body regions 415 that extend through SiGe layer 410 and terminate in silicon epitaxial layer 405. Gate electrodes 420 can be used as a mask during body implant 415 so that body regions 415 become self-aligned with gate electrodes 420. In some embodiments, dopants such as boron, gallium, aluminum, other group III dopants or various combinations thereof may be used in body implant 415. Body implant 415 converts those portions of SiGe layer 410 that extend through body regions 415 to P-type. Accordingly, silicon germanium layer 410 includes P-type regions 410a and N-type regions 410b.

Figure 9D:
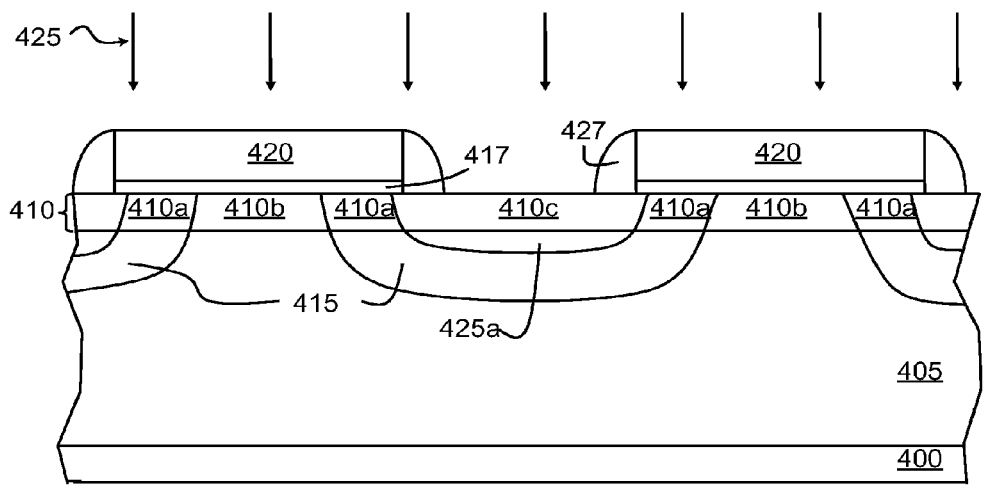

In FIG. 9D, dielectric spacers 427 (e.g., comprising oxide and/or nitride) are formed along sidewalls of gate electrodes 420 using known techniques. Source implant 425 is then carried out to form highly doped N-type source regions 425 in body regions 415. Dielectric spacers 427 can be used as a mask during source implant 425 so that source regions 425 become self-aligned with dielectric spacers 427. The extend to which gate electrodes 420 overlap source regions 425 can be controlled by adjusting the thickness of dielectric spacers 427. Note that portions 410c of SiGe layer 410 which receive source implant 425 are converted to N-type.

Figure 9E:
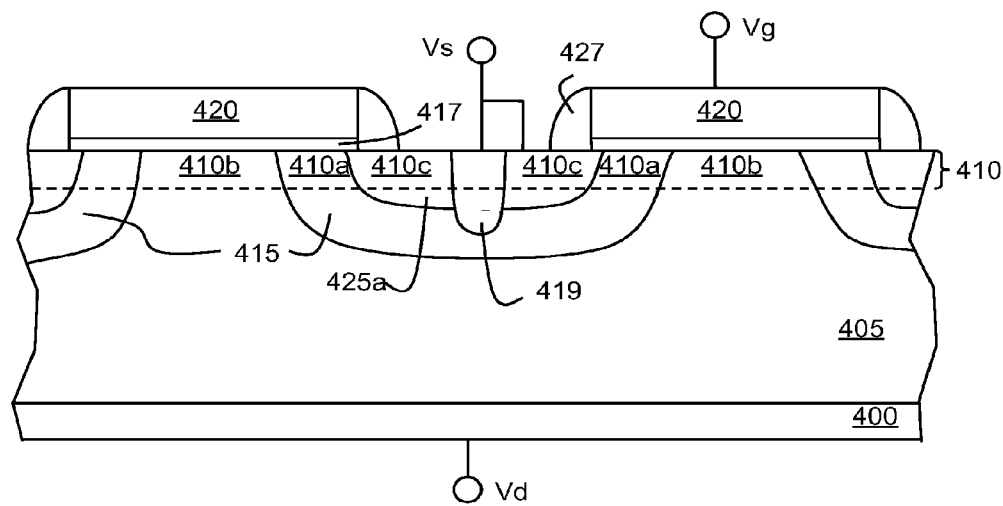

In FIG. 9E, highly dope P-type heavy body regions 419 extending through source regions 425 and into body regions 425 are formed using a conventional heavy body implant. A mask may be used to define the areas that are to receive the heavy body implant. The line delineating SiGe layer 410 is shown as a dashed line in FIG. 9E in order to make the diagram less cluttered. Next, conventional techniques are used to form a dielectric layer (not shown), e.g., comprising boron-phosphorus-silicate-glass (BPSG), covering gate electrodes 420 while leaving surface areas of source regions 425 and heavy body regions 419 exposed. A top-side interconnect layer (not shown) electrically contacting source regions 425 and heavy body regions 419 is then formed using known techniques. A bottom-side interconnect layer contacting substrate 400 is formed on the backside using conventional techniques. The top-side and bottom-side interconnect layers may comprise a metal.

During operation, when an appropriate source voltage Vs, gate voltage Vg and drain voltage Vd are applied to turn on the transistor, a current flows through the channel region formed in portions 410a of SiGe layer 410. As with the FIG. 1 embodiment, the higher mobility associated with the strained SiGe layer 410 reduces the channel resistance, thus lowering the transistor Rdson.

While the various embodiments of the invention have been described in the context of particular types of transistor, the invention is not limited as such. For example, while one or more of the device structures and/or process sequences described above relate to N-channel and P-channel variations of MOSFETs and IGBTs, the techniques in accordance with embodiments of the invention may also be applied other types of devices such as trench gate synchFETs (where Schottky diode is monolithically integrated with trench gate or shielded gate MOSFET) or suprejunction variations of the devices described herein (i.e., devices with columns of alternating conductivity type silicon). Therefore, the above description should not be taken as limiting the scope of the invention, which is defined by the appended claims.

What is claimed is:

1. A vertically-conducting planar-gate field effect transistor comprising:
    a silicon region of a first conductivity type;
    a silicon-germanium layer extending over the silicon region;
    gate electrode laterally extending over but being insulated from the silicon-germanium layer;
    a body region of the second conductivity type extending in the silicon-germanium layer and the silicon region; and
    source region of the first conductivity type extending in the silicon-germanium layer, the gate electrode laterally overlapping both the source and body regions such that a portion of the silicon germanium layer extending directly under the gate electrode between the source region and an outer boundary of the body region forms a channel region.

2. The transistor of claim 1 wherein the portion of the silicon-germanium layer through which the source region extends is of first conductivity type, and the portion of the silicon-germanium layer through which the body region extends is of the second conductivity type.

3. A method of forming a vertically-conducting planar-gate field effect transistor comprising:
    forming a silicon-germanium layer over a silicon region of a first conductivity type;
    forming a gate electrode laterally extending over but insulated from the silicon-germanium layer;
    forming a body region of a second conductivity type extending in the silicon-germanium layer and the silicon region; and
    forming a source region of the first conductivity type extending at least into the silicon-germanium layer, the gate electrode laterally overlapping both the source and body regions such that a portion of the silicon germanium layer extending directly under the gate electrode between the source region and an outer boundary of the body region forms a channel region.

4. The method of claim 3 further comprising:
    prior to forming source regions, forming dielectric spacers along sidewalls of the gate electrode.

* * * * *